US006535106B2

(12) United States Patent
Teramae

(10) Patent No.: US 6,535,106 B2
(45) Date of Patent: Mar. 18, 2003

(54) CHIP RESISTOR

(75) Inventor: Toshihiro Teramae, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/046,059

(22) Filed: Jan. 15, 2002

(65) Prior Publication Data

US 2002/0140541 A1 Oct. 3, 2002

Related U.S. Application Data

(62) Division of application No. 09/058,296, filed on Apr. 10, 1998, now abandoned.

(30) Foreign Application Priority Data

Nov. 4, 1997 (JP) ............................................ 9-093964

(51) Int. Cl.[7] ............................................... H01L 1/012
(52) U.S. Cl. ........................ 338/309; 29/610.1; 338/309
(58) Field of Search ................................ 338/256, 257, 338/307, 308, 309, 313, 314; 29/610, 610.1, 620, 621

(56) References Cited

U.S. PATENT DOCUMENTS 5,379,017 A * 1/1995 Katsuno ..................... 338/332
5,593,722 A * 1/1997 Otani et al. ................. 427/101
5,815,065 A * 9/1998 Hanamura .................. 338/309
6,153,256 A * 11/2000 Kambara et al. ........... 427/103
6,201,290 B1 * 3/2001 Nakayama et al. ......... 338/309

* cited by examiner

*Primary Examiner*—Elvin Enad
*Assistant Examiner*—Kyung S. Lee
(74) *Attorney, Agent, or Firm*—Arent Fox Kintner Plotkin & Kahn, PLLC

(57) ABSTRACT

A chip resistor reveals a crack for permitting easy detection of it in the inspection process, suffers from minimum variation of the resistance during calcination of a protection film, and is not prone to defects such as pinholes that do not come to the surface. This chip resistor is produced by forming a resistive layer on the surface of an insulating substrate, providing electrodes at both ends of the resistive layer, forming a resistive-layer protection film on the surface of the resistive layer, forming an intermediate protection film on the surface of the resistive-layer protection film, and forming a surface protection film on the surface of the intermediate protection film. In addition, in this chip resistor, the resistive-layer protection film, intermediate protection film, and surface protection film are all made of an identical material.

4 Claims, 2 Drawing Sheets

CHIP RESISTOR

This is a Division of application Ser. No. 09/058,296 filed Apr. 10, 1998, now abandoned. The disclosure of the prior application is hereby incorporated by reference herein in its entirety.

BACKGROUND OF THE INVENTION

1. Field of the Invention

The present invention relates to an improvement on a chip resistor.

2. Description of the Prior Art

Chip resistors that have conventionally been in wide use are produced by forming a resistive layer on the surface of an insulating substrate, providing electrodes at both ends of the resistive layer, and forming one or more protective films on the surface of the resistive layer. FIG. 4 shows a vertical section of such a chip resistor. This figure shows a chip resistor having three protective films formed on the surface of its resistive layer, with numeral 1 representing an insulating substrate made of, for example, ceramics, numeral 2 representing a resistive layer formed on the surface of the substrate 1, numeral 3 representing electrodes provided at both ends of the resistive layer 2, numeral 4 representing a resistive-layer protection film, numeral 5' representing an intermediate protection film, and numeral 6' representing a surface protection film. Each protection film is made essentially of glass paste. The electrodes 3 have their surfaces metal-plated.

The protection films are formed as follows. First, the material for the resistive-layer protection film 4 is applied to the surface of the resistive layer 2, and is then subjected to drying and calcination. At this time, the resistive-layer protection film 4 serves to reduce the variation of (i.e. stabilize) the resistance of the resistive layer 2 under calcination. Thereafter, the resistive layer 2 is trimmed, for example, with a laser beam for the adjustment of its resistance. Subsequently, the intermediate protection film 5' is applied to the surface of the resistive-layer protection film 4 and is then subjected to drying. Subsequently, the surface protection film 6' is applied to the surface of the intermediate protection film 5' and is then subjected to drying. Lastly, the surface protection film 6' is subjected to calcination. It is also possible to subject the intermediate protection film 5' to calcination before the application, drying, and calcination of the surface protection film 6'.

In general, the resistive-layer protection film 4 is provided, as described above, for the purpose of reducing the variation of the resistance of the resistive layer 2 under calcination; the intermediate protection film 5' is provided for the purpose of filling trimming grooves that are left after the above-mentioned trimming; the surface protection film 6' is provided for the purpose of protecting the resistor against mechanical force that may be applied from outside. Thus, in a conventional chip resistor, these protection films, to serve their respective intended purposes, need to be made of materials having different properties in terms of their softening point, Vickers hardness, thermal expansion coefficient, and others. This leads to the following inconveniences.

For one thing, when a chip resistor, in the manufacturing process, receives mechanical force from outside, the chip resistor may develop, as shown in FIG. 5, a crack that penetrates completely through the surface protection film 6' and the intermediate protection film 5' but only halfway into the resistive-layer protection film 4. In actual use, a chip resistor with such a crack, when heat is applied thereto during soldering, often ends in the crack reaching the resistive layer 2 and thus the chip resistor having a resistance different from the intended resistance. In this case, exactly because each protection film is made of a different material, the crack tends to take a non-linear path and thus remain inside, without coming to the surface.

Alternatively, in cases where the intermediate protection film 5' is made of a mechanically weak material, the chip resistor may develop, as shown in FIG. 6, multiple cracks in the intermediate protection film 5', and in addition the differences in the thermal expansion coefficient between the protection films cause stress to be present at all times between those films. This makes the chip resistor susceptible to a thermal shock such as is caused by soldering.

Moreover, the difference in the softening point between the intermediate protection film 5' and the surface protection film 6' makes it difficult to determine the appropriate calcination temperature. This leads to instability of the resistance of the resistive layer 2 under calcination, or causes, in the protection films, defects such as pinholes that do not come to the surface. These faults are difficult to detect in the inspection process, and thus chip resistors having such a fault are in many cases shipped out as non-defective products, with their fault unnoticed.

SUMMARY OF THE INVENTION

An object of the present invention is to provide a chip resistor that reveals a crack for permitting easy detection of it in the inspection process, that suffers from minimum variation of the resistance during calcination of a protection film, and that is not prone to defects such as pinholes that do not come to the surface.

To achieve the above object, according to the present invention, in a chip resistor produced by forming a resistive layer on the surface of an insulating substrate, providing electrodes at both ends of the resistive layer, forming a resistive-layer protection film on the surface of the resistive layer, forming an intermediate protection film on the surface of the resistive-layer protection film, and forming a surface protection film on the surface of the intermediate protection film, the resistive-layer protection film, the intermediate protection film, and the surface protection film are all made of an identical material.

Alternatively, in a chip resistor produced by forming a resistive layer on the surface of an insulating substrate, providing electrodes at both ends of the resistive layer, forming a resistive-layer protection film on the surface of the resistive layer, and forming a surface protection film on the surface of the resistive-layer protection film, the resistive-layer protection film and the surface protection film are both made of an identical material.

In these chip resistors, the protection films are made essentially of lead-borosilicate glass of an identical composition. More specifically, the lead-borosilicate glass preferably has the following properties:

| | |
|---|---|
| Softening point: | 570–620° C.; |
| Vickers hardness: | 400–600 Hv<br>(after submission to a load of 200 g for 30 s); and |
| Thermal expansion coefficient: | $40–70 \times 10^{-7}$/° C.<br>(in a temperature range of 30–300° C. ). |

Moreover, the protection films are preferably made of glass paste that contains lead-borosilicate glass in the form of particles 2–10 μm across and that contains terpineol or butyl carbitol acetate as solvent.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
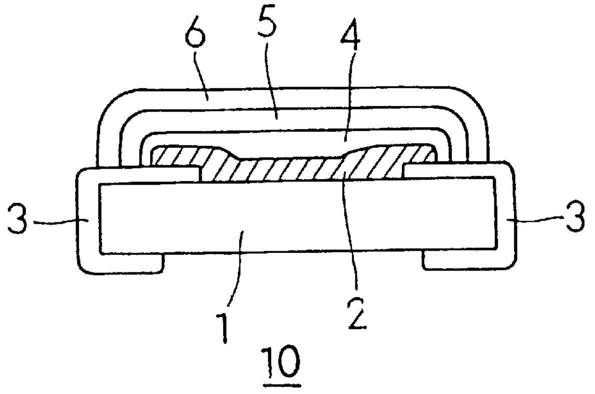
FIG. 1 is a vertical section illustrating the structure of a chip resistor embodying the invention.
Figure 4:
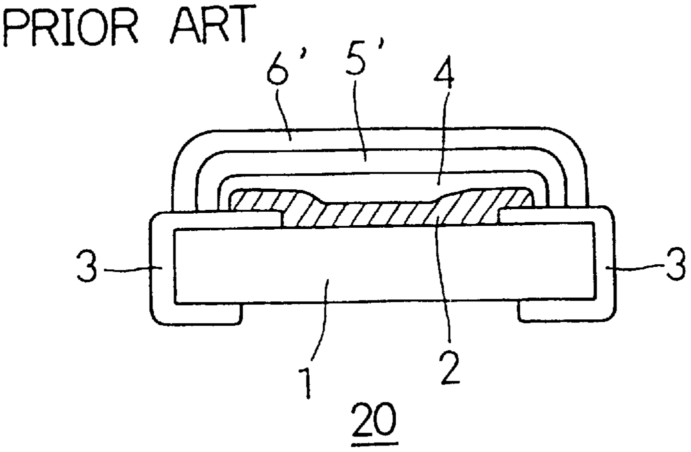
FIG.4 PRIOR ART
FIG. 4 is a vertical section illustrating the structure of a conventional chip resistor.
Figure 5:
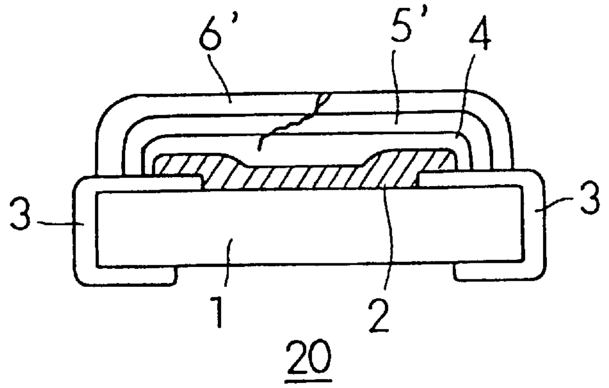
FIG.5 PRIOR ART
FIG. 5 is a diagram showing an example of a crack that may occur in the conventional chip resistor.
Figure 6:
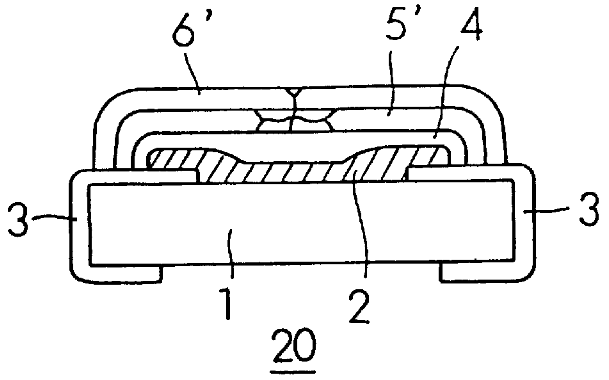
FIG.6 PRIOR ART
FIG. 6 is a diagram showing another example of a crack that may occur in the conventional chip resistor.

Hereinafter, an embodiment of the present invention will be described with reference to the drawings. FIG. 1 shows the structure of a chip resistor 10 embodying the invention. Numeral 1 represents an insulating substrate made of, for example, ceramics, numeral 2 represents a resistive layer formed on the surface of the substrate 1, and numeral 3 represents electrodes provided at both ends of the resistive layer 2. The components so far mentioned are the same as the corresponding components in the conventional chip resistor 20 shown in FIG. 4. Numeral 4 represents a resistive-layer protection film, numeral 5 represents an intermediate protection film, and numeral 6 represents a surface protection film.

Figure 2:
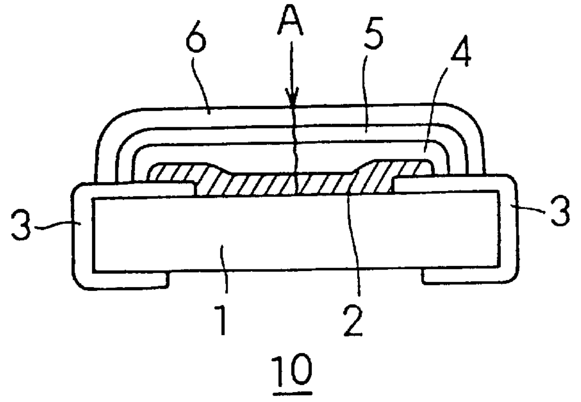
FIG. 2 is a diagram showing an example of a crack that may occur in the chip resistor of the invention.
Figure 3:
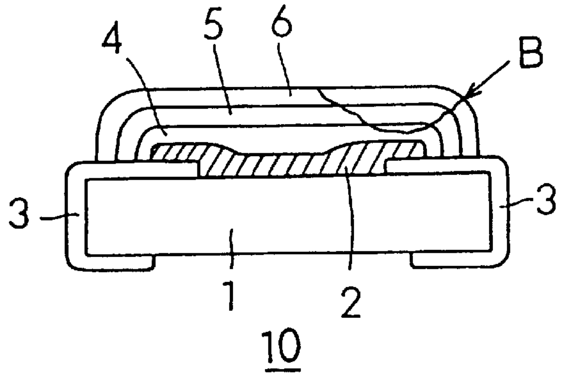
FIG. 3 is a diagram showing another example of a crack that may occur in the chip resistor of the invention.

To overcome the inconveniences mentioned earlier, in the chip resistor 10 of the invention, the protection films 4 to 6 are all made of an identical material. As a result, when force is applied from outside vertically to the protection films of the chip resistor as indicated by arrow A in FIG. 2, the chip resistor develops a crack that reaches the resistive layer 2 and thus makes the resistance different from the intended resistance. This makes it possible, in the inspection process, to detect the crack by measuring the resistance and thereby reject chip resistors having such a crack as being defective. Alternatively, when force is applied from outside at an angle to the protection films of the chip resistor as indicated by arrow B in FIG. 3, the chip resistor develops a crack that comes back to the surface and thus is recognizable as a crack. This makes it possible, in the inspection process, to detect the crack by use of an appearance recognition system and thereby reject chip resistors having such a crack as being defective.

Moreover, since the surface protection film 6 and the intermediate protection film 5 have the same thermal expansion coefficient as the resistive-layer protection film 4, calcination of the surface protection film 6 and the intermediate protection film 5 causes minimum variation of the resistance. Furthermore, since the surface protection film 6 and the intermediate protection film 5, when subjected to calcination simultaneously, start to soften approximately at the same time. This makes it possible to determine calcination conditions that suit both of these films and thereby minimize formation of defects such as pinholes.

In the chip resistor 10 of the invention, the intermediate protection film 5 and the surface protection film 6 are made of the material that has conventionally been used to make the resistive-layer protection film 4. More specifically, these films are made essentially of glass that is prepared in the form of glass paste for easy application, with the glass and the glass paste having the following properties:

| | |
|---|---|
| (1) Properties of the Glass | |
| a) Chief Ingredient: | Lead-Borosilicate Glass |
| b) Softening Point: | 570–620° C. |
| c) Vickers Hardness: | 400–600 Hv<br>(after submission to a load of 200 g for 30 s) |
| d) Thermal Expansion Coefficient: | $40–70 \times 10^{-7}$/° C.<br>(in a temperature range of 30–300° C.). |
| (2) Properties of the Glass Paste | |
| 1) Glass Particle Diameter: | 2–10 μm |
| 2) Solvent: | Terpineol or Butyl Carbitol Acetate |
| (3) Film Thicknesses after Calcination | |
| 1) When the surface protection film 6 is pigmented, | |
| Resistive-Layer Protection Film 4: | 2–10 μm<br>(≧ the glass particle diameter) |
| Intermediate Protection Film 5: | 2–10 μm<br>(≧ the glass particle diameter) |
| Surface Protection Film 6: | 5–20 μm |
| 2) When the intermediate protection film 5 is pigmented, | |
| Resistive-Layer Protection Film 4: | 2–10 μm<br>(≧ the glass particle diameter) |
| Intermediate Protection Film 5: | 5–20 μm |
| Surface Protection Film 6: | 2–10 μm<br>(≧ the glass particle diameter) |

| (2) Properties of the Glass Paste | | |
|---|---|---|
| 1) | Glass Particle Diameter: | 2–10 μm |
| 2) | Solvent: | Terpineol or Butyl Carbitol Acetate |

| (3) Film Thicknesses after Calcination | |
|---|---|
| 1) When the surface protection film 6 is pigmented, | |
| Resistive-Layer Protection Film 4: | 2–10 μm (≧ the glass particle diameter) |
| Intermediate Protection Film 5: | 2–10 μm (≧ the glass particle diameter) |
| Surface Protection Film 6: | 5–20 μm |
| 2) When the intermediate protection film 5 is pigmented, | |
| Resistive-Layer Protection Film 4: | 2–10 μm (≧ the glass particle diameter) |
| Intermediate Protection Film 5: | 5–20 μm |
| Surface Protection Film 6: | 2–10 μm (≧ the glass particle diameter) |

Note that the thermal expansion coefficient above is close to that of ceramics. Note also that, to fill the trimming grooves efficiently, it is possible, if necessary, to use for the intermediate protection film 5 such glass paste that contains glass particles of a comparatively small diameter or that contains a comparatively large proportion of solvent. In general, however, a glass particle diameter of 6 to 8 μm is most preferable to achieve proper filling of the trimming grooves and at the same time secure an adequate film thickness.

When the nominal resistance or other information is printed on the surface of the chip resistor, pigment of black or other color is added to the intermediate protection film 5 and the surface protection film 6 to obtain sufficient contrast between the printed characters or other and the background. The other protection film may be left transparent, with or without color, but, when printing is applied, it is preferable that it be colored. Note however that there are also some cases in which no pigment is required at all.

Although not shown in the figures, in some cases, only two protection films are required. For example, when the chip resistor is conveyed by use of a vacuum-absorption conveyor in the mounting process on a printed circuit board, its surface is required to be as flat as possible; in such cases, forming only two protection films tends to result in a better flatness than forming three protection films. There are also cases where trimming is performed before any protection film is formed on the surface of the resistive layer 2; in such cases, too, it suffices to form only two protection films. In any case, what structure to adopt is determined in consideration of the desired mechanical strength and the production cost.

As described heretofore, the chip resistor according to the present invention provides the following advantages. It permits easy detection of a crack in the inspection process since the crack readily comes to the surface, and thus it provides a resistance less affected by soldering or the like. It allows all of its protection films to have an identical thermal expansion coefficient, and thus it suffers from minimum variation of the resistance during calcination of a protection film. It allows all of its protection films to have an identical softening point, and thus it is not prone to defects such as pinholes that do not come to the surface.

What is claimed is:

1. A method of manufacturing a chip resistor comprising:

a first step of forming a resistive layer on an insulating substrate;

a second step of providing electrodes at both ends of the resistive layer;

a third step of forming a resistive-layer protection film so as to cover the resistive layer;

a fourth step of trimming the resistive layer and the resistive-layer protection film so as to adjust a resistance of the resistive layer;

a fifth step of forming an intermediate protection film so as to cover the resistive-layer protection film and fill a trimming groove carved in the insulating substrate in the fourth step; and a sixth step of forming a surface protection film so as to cover the intermediate protection film, wherein the resistive-layer protection film formed in the third step, the intermediate protection film formed in the fifth step, and the surface protection film formed in the sixth step are all formed out of glass paste made of identical glass, and the intermediate protection film formed in the fifth step is formed out of glass paste made of glass particles having a particle diameter of 2 to 10 μm, wherein the resistive-layer protection film formed in the third step, the intermediate protection film formed in the fifth step, and the surface protection film formed in the sixth step are formed out of glass paste made of glass having a softening point of 570 to 620° C., a Vickers hardness of 400 to 600 Hv after submission to a load of 200 g for 30 s, and a thermal expansion coefficient of 40 to $70\times10^{-7}$/° C. in a temperature range of 30 to 300° C.

2. A method of manufacturing a chip resistor comprising:

a first step of forming a resistive layer on an insulating substrate;

a second step of providing electrodes at both ends of the resistive layer;

a third step of forming a resistive-layer protection film so as to cover the resistive layer;

a fourth step of trimming the resistive layer and the resistive-layer protection film so as to adjust a resistance of the resistive layer;

a fifth step of forming an intermediate protection film so as to cover the resistive-layer protection film and fill a trimming groove carved in the insulating substrate in the fourth step; and a sixth step of forming a surface protection film so as to cover the intermediate protection film, wherein the resistive-layer protection film formed in the third step, the intermediate protection film formed in the fifth step, and the surface protection film formed in the sixth step are all formed out of glass paste made of identical glass, and the intermediate protection film formed in the fifth step is formed out of glass paste made of glass particles having a particle diameter of 2 to 10 μm, wherein the resistive-layer protection film formed in the third step, the intermediate protection film formed in the fifth step, and the surface protection film formed in the sixth step are formed out of glass paste made of glass having an identical thermal expansion coefficient with the insulating substrate.

3. A method of manufacturing a chip resistor comprising:

a first step of forming a resistive layer on an insulating substrate;

a second step of providing electrodes at both ends of the resistive layer;

a third step of forming a resistive-layer protection film so as to cover the resistive layer;

a fourth step of trimming the resistive layer and the resistive-layer protection film so as to adjust a resistance of the resistive layer; and a fifth step of forming a surface protection film so as to cover the resistive-layer protection film and fill a trimming groove carved in the insulating substrate in the fourth step;

wherein the resistive-layer protection film formed in the third step and the surface protection film formed in the fifth step are both formed out of glass paste made of identical glass, and the surface protection film formed in the fifth step is formed out of glass paste made of glass particles having a particle diameter of 2 to 10 $\mu$m, wherein said the resistive-layer protection film formed in the third step and the surface protection film in the fifth step are formed out of glass paste made of glass having a softening point of 570 to 620° C., a Vickers hardness of 400 to 600 Hv after submission to a load of 200 g for 30 s, and a thermal expansion coefficient of 40 to $70\times10^{-7}$/° C. in a temperature range of 30 to 300° C.

4. A method of manufacturing a chip resistor comprising:

a first step of forming a resistive layer on an insulating substrate;

a second step of providing electrodes at both ends of the resistive layer;

a third step of forming a resistive-layer protection film so as to cover the resistive layer;

a fourth step of trimming the resistive layer and the resistive-layer protection film so as to adjust a resistance of the resistive layer; and a fifth step of forming a surface protection film so as to cover the resistive-layer protection film and fill a trimming groove carved in the insulating substrate in the fourth step;

wherein the resistive-layer protection film formed in the third step and the surface protection film formed in the fifth step are both formed out of glass paste made of identical glass, and the surface protection film formed in the fifth step is formed out of glass paste made of glass particles having a particle diameter of 2 to 10 $\mu$m, wherein the resistive-layer protection film formed in the third step and the surface protection film formed in the fifth step are formed out of glass paste made of glass having an identical thermal expansion coefficient with the insulating substrate.

* * * * *

UNITED STATES PATENT AND TRADEMARK OFFICE

CERTIFICATE OF CORRECTION

PATENT NO. : 6,535,106 B2
DATED : March 18, 2003
INVENTOR(S) : Toshihiro Teramae It is certified that error appears in the above-identified patent and that said Letters Patent is hereby corrected as shown below:

Title page,
Item [30], correct the date on the Foreign Application Priority Data from "Nov. 4, 1997" to -- Apr. 11, 1997 --.

Signed and Sealed this

Twelfth Day of August, 2003

JAMES E. ROGAN
*Director of the United States Patent and Trademark Office*